United States Patent
Cheng et al.

(10) Patent No.: US 10,157,941 B2
(45) Date of Patent: Dec. 18, 2018

(54) IMAGE SENSOR AND FABRICATION METHOD THEREOF

(71) Applicant: TAIWAN SEMICONDUCTOR MANUFACTURING CO., LTD., Hsinchu (TW)

(72) Inventors: Chia-Pin Cheng, Kaohsiung (TW); Fu-Cheng Chang, Tainan (TW); Ching-Hung Kao, Tainan (TW); Che-Chun Lu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/353,835

(22) Filed: Nov. 17, 2016

(65) Prior Publication Data

US 2018/0138218 A1    May 17, 2018

(51) Int. Cl.
*H01L 31/062* (2012.01)
*H01L 27/146* (2006.01)

(52) U.S. Cl.
CPC .... *H01L 27/14603* (2013.01); *H01L 27/1463* (2013.01); *H01L 27/14643* (2013.01); *H01L 27/14689* (2013.01)

(58) Field of Classification Search
CPC ........... H01L 27/14609; H01L 27/1463; H01L 27/14689; H01L 27/14603; H01L 27/14643; H01L 27/1461; H01L 27/0802; H01L 27/14607; H01L 27/14612; H01L 27/14636; H01L 27/1464; H01L 27/14641; H01L 27/14654

USPC .......... 257/E27.132, 292, E27.131, E27.133, 257/461, E27.047, E27.139, 213, 221, 257/223, 224, 230, 288, 291, 396, 423, 257/444, 445, 446, 462, 466; 250/208.1; 348/294; 438/197, 200, 48; 716/112, 716/136
See application file for complete search history.

(56) References Cited

U.S. PATENT DOCUMENTS

| | | | | |
|---|---|---|---|---|
| 6,096,573 A | * | 8/2000 | Chen | H01L 27/14689 438/48 |
| 6,462,365 B1 | * | 10/2002 | He | H01L 27/14603 257/292 |
| 6,501,109 B1 | * | 12/2002 | Chi | H01L 27/14609 257/223 |
| 6,642,076 B1 | * | 11/2003 | Yaung | H01L 27/0802 257/288 |

(Continued)

*Primary Examiner* — Edward Chin
(74) *Attorney, Agent, or Firm* — McClure, Qualey & Rodack, LLP

(57) ABSTRACT

An image sensor and a fabrication method thereof are provided. In the fabrication method of the image sensor, at first, two isolation features are formed in a substrate to define a pixel region. Then, a floating node and a pinning layer are formed in one of the isolation features, in which a space region is located between the floating node and the pinning layer, and the floating node has a first conductivity type different from a second conductivity type of the pinning layer. Thereafter, a light-sensitive element is formed in the pixel region, and a transfer gate is formed on the pixel region, thereby forming a pixel. Since there is a space region located between the floating node and the pinning layer, a leakage path between the floating node and the pinning layer can be prevented.

20 Claims, 14 Drawing Sheets

(56) References Cited

U.S. PATENT DOCUMENTS

| | | | | |
|---|---|---|---|---|
| 7,334,211 B1* | 2/2008 | Toros | ............ | G06F 17/5009 |
| | | | | 257/E27.131 |
| 8,896,734 B2* | 11/2014 | Shinohara | ......... | H01L 27/14607 |
| | | | | 257/213 |
| 9,318,520 B2* | 4/2016 | Fujii | ............. | H01L 27/14609 |
| 9,748,290 B2* | 8/2017 | Lee | ............ | H01L 27/14643 |
| 2005/0062085 A1* | 3/2005 | He | ............ | H01L 27/1463 |
| | | | | 257/292 |
| 2005/0274874 A1* | 12/2005 | Nozaki | ............ | H01L 27/14689 |
| | | | | 250/208.1 |
| 2006/0157758 A1* | 7/2006 | Rhodes | ............ | H01L 27/14609 |
| | | | | 257/292 |

\* cited by examiner

310

IMAGE SENSOR AND FABRICATION METHOD THEREOF

BACKGROUND

Complementary metal-oxide semiconductor (CMOS) sensors are generally used in charged-coupled devices (CCDs). The CMOS sensor is typically fabricated by using integrated circuit (IC) technology and includes a plurality of pixels and logic circuits. The pixel includes a light-sensitive element to convert photons into electrons. The electrons are converted into an electric signal by using the logic circuits.

Because of the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
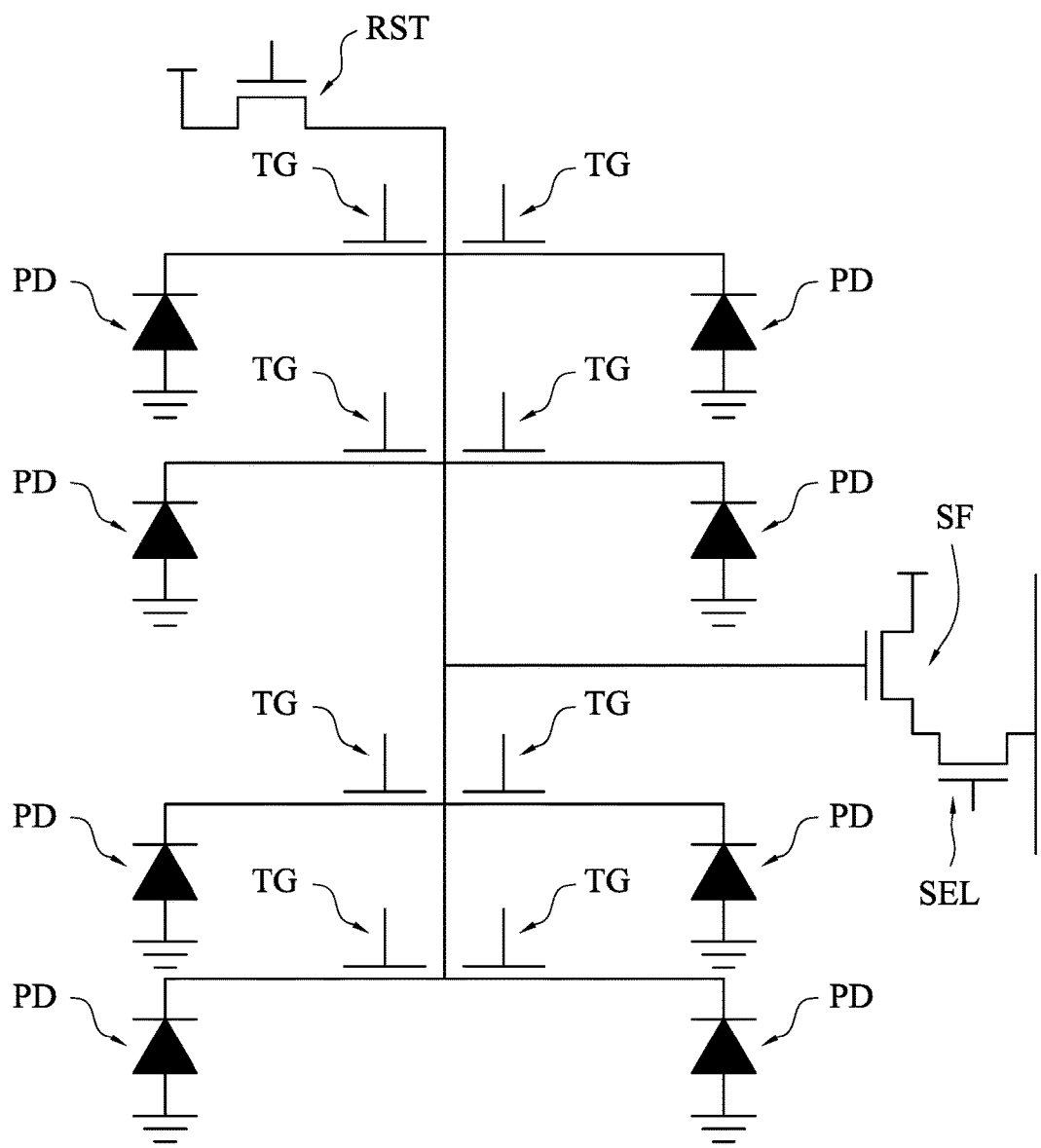
FIG. 1 is a schematic diagram showing a circuit structure of an image sensor 100 in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to an image sensor and a fabrication method thereof. The image sensor includes multiple pixels sharing a source follower. In the fabrication method of the image sensor, at first, a semiconductor substrate is provided. Then, a trench isolation structure is formed in the semiconductor substrate. Thereafter, isolation regions are formed in the semiconductor substrate to define a pixel region, in which one of the isolation regions is formed to surround the trench isolation structure. Then, a floating node and a pinning layer are formed in another one of the isolation regions, in which a space region is located between the floating node and the pinning layer, and the floating node has a first conductivity type different from a second conductivity type of the pinning layer. Thereafter, a light-sensitive element is formed in the pixel region, and a transfer gate is formed on the pixel region, thereby forming a pixel. Since there is a space region located between the floating node and the pinning layer, a leakage path between the floating node and the pinning layer can be prevented.

Referring to FIG. 1. FIG. 1 is a schematic diagram showing a circuit structure of an image sensor 100 in accordance with an embodiment of the present disclosure. The image sensor 100 has an X-share pixel design, in which X is a positive integer. In this embodiment, the image sensor 100 has an 8-share pixel design. In other words, in the image sensor 100, eight pixels share one source follower. However, embodiments of the present disclosure are not limited thereto. In some embodiments of the present disclosure, the image sensor 100 includes a 4-share pixel design. The image sensor 100 includes light-sensitive elements PD, transfer gates TG and a source follower SF. The light-sensitive elements PD are configured to convert photons into electrons. The transfer gates transistors TG are configured to transfer the electrons to a floating node FD, and then the source follower SF receives the electrons of the light-sensitive elements PD from the floating nodes FD. In addition, the image sensor 100 further includes a resent transistor RST and a selection transistor SEL for a resent function and a selection function.

Figure 2:
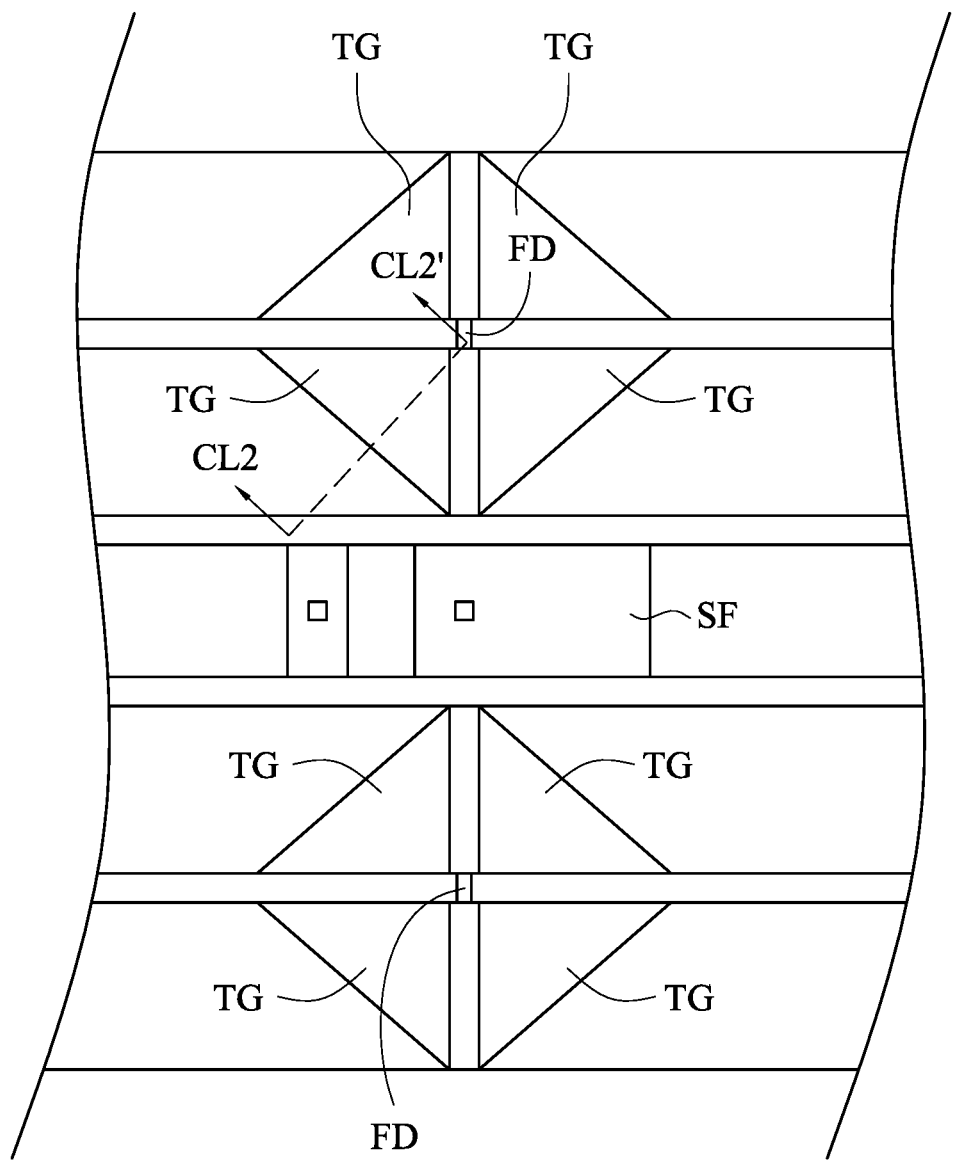
FIG. 2 is a schematic diagram showing a layout of the image sensor in accordance with an embodiment of the present disclosure.
Figure 3:
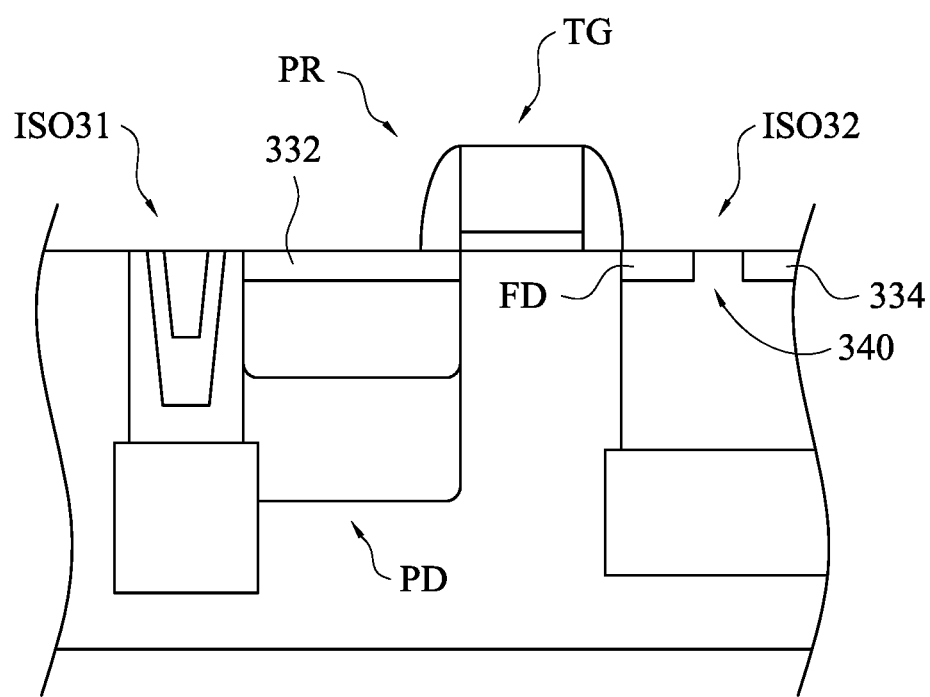
FIG. 3 is a cross-sectional view of the image sensor viewed along line CL2-CL2' in FIG. 2
Figure 4:
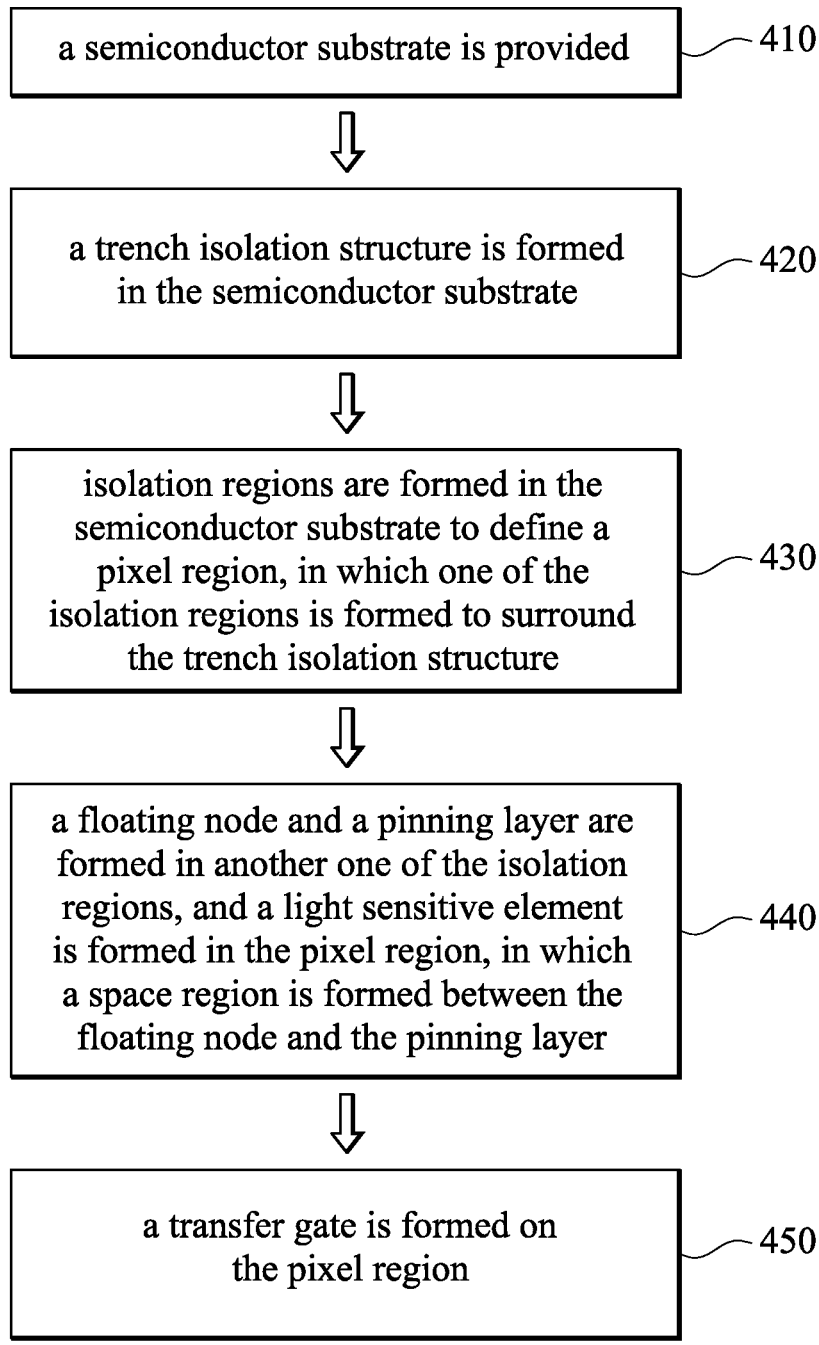
FIG. 4 is a flow chart showing a method for fabricating the image sensor in accordance with some embodiments of the present disclosure.

Referring to FIG. 2 and FIG. 3, FIG. 2 is a schematic diagram showing a layout of the image sensor 100 in accordance with an embodiment of the present disclosure, and FIG. 3 is a cross-sectional view of the image sensor 100 viewed along line CL2-CL2' in FIG. 2. As shown in FIG. 2, the source follower SF divides the eight pixels into two groups each having four of the eight pixels. As shown in FIG. 3, isolation features ISO31 and ISO32 are formed in a semiconductor substrate 310 to define a pixel region PR in a semiconductor substrate 310. The light-sensitive element PD and the transfer gate TG are formed in the pixel region PR, and the floating node FD is formed in the isolation feature ISO32 adjacent to the transfer gate TG. The light-sensitive element PD, the transfer gate TG and the floating node FD can be considered as a pixel of the image sensor 100. Pining layers 332 and 334 are formed to protect a surface of the semiconductor substrate 310. In this embodiment, the pining layers 332 and 324 are formed adjacent to a top surface of the semiconductor substrate 310 on which the transfer gate TG is located, thereby protecting the top surface of the semiconductor substrate 310. It is noted that there is a space region 340 located between the pining layer 334 and the floating node FD, thereby preventing a leakage path between the floating node FD and the pinning layer 334.

For example, the floating node FD has a first conductivity type, and the pinning layer 334 has a second conductivity type different from the first conductivity type. Specifically, the floating node FD is doped with an n-type dopant, and the pinning layer 334 is doped with a p-type dopant. If the floating node FD contacts the pinning layer 334, a leakage path is induced between the floating node FD and the pinning layer 334, and an undesired white pixel pattern is induced. In this embodiment, a space region 340 is sandwiched between the floating node FD and the pinning layer 334 to isolate the floating node FD from the pinning layer 334, thereby preventing the leakage path.

Figure 5A:
FIG. 5a to FIG. 5e are cross-sectional views of intermediate stages showing the method for fabricating the image sensor in accordance with some embodiments of the present disclosure.

Referring to FIG. 4 and FIG. 5a to FIG. 5e, FIG. 4 is a flow chart showing a method 400 for fabricating the image sensor 100 in accordance with some embodiments of the present disclosure, and FIG. 5a to FIG. 5e are cross-sectional views of intermediate stages showing the method 400 for fabricating the image sensor 100 in accordance with some embodiments of the present disclosure. In the method 400, at first, operation 410 is performed to provide the semiconductor substrate 310, as shown in FIG. 5a. The substrate 310 may be a semiconductor material and may include structures including a graded layer or a buried oxide, for example. In some embodiments, the substrate 310 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 310. Alternatively, the silicon substrate 310 may be an active layer of a semiconductor-on-insulator (SOI) substrate or a multi-layered structure such as a silicon-germanium layer formed on a bulk silicon layer. In this embodiment, the substrate 310 is doped with p-type dopant.

Figure 5B:
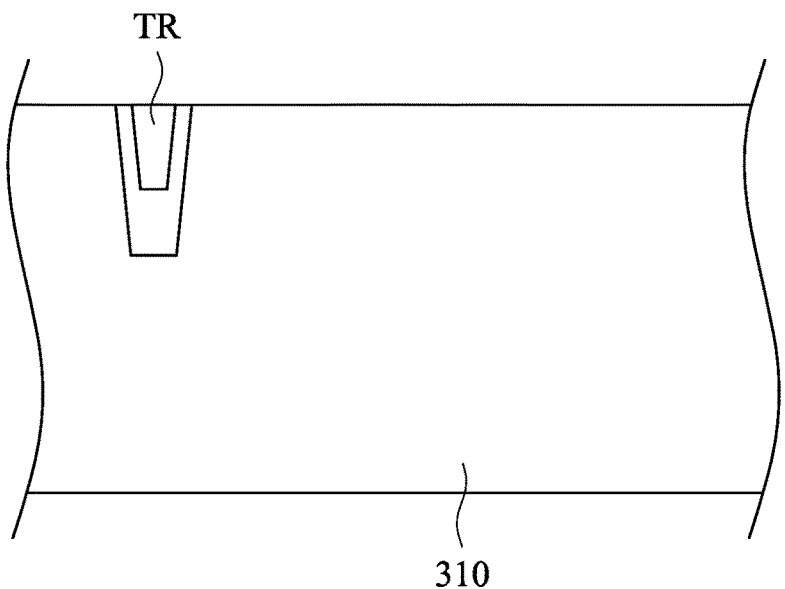

Then, operation 420 is performed to form the trench isolation structure TR in the semiconductor substrate 310, as shown in FIG. 5b. In this embodiment, the trench isolation structure TR is a shallow trench isolation (STI) structure, but embodiments of the present disclosure are not limited thereto. In some embodiments, the formation of the trench isolation structure TR may include dry etching a trench in the substrate 310 and filling the trench with insulator materials such as silicon oxide, silicon nitride, or silicon oxynitride. The filled trench may have a multi-layer structure such as a thermal oxide liner layer filled with silicon nitride or silicon oxide. In some embodiments, the trench isolation structure TR may be formed by using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

Figure 5C:
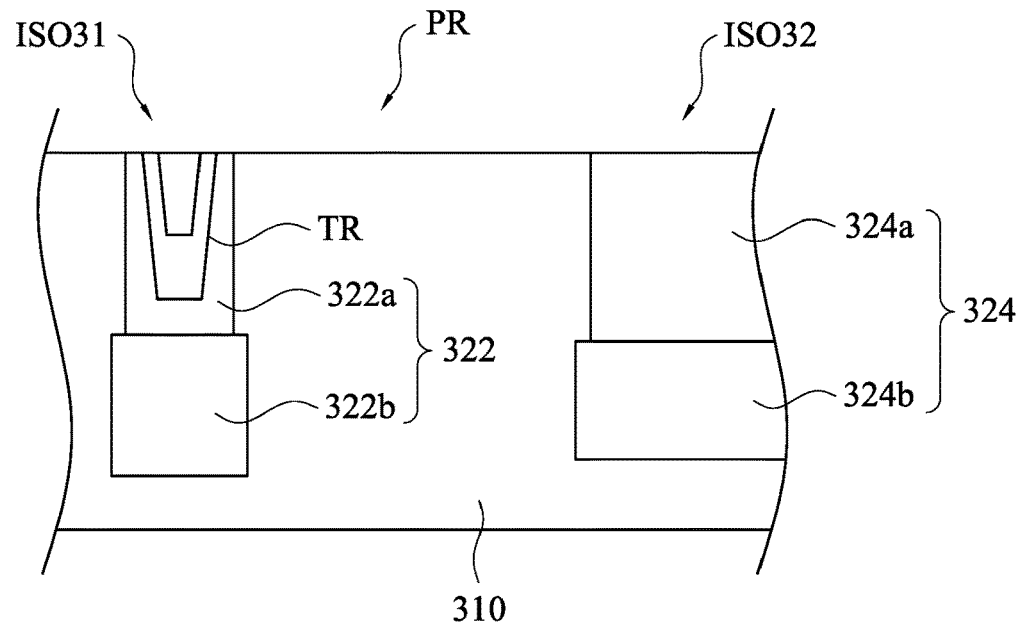

Thereafter, operation 430 is performed to form isolation regions 322 and 324 in the substrate 310 to define a pixel region PR, as shown in FIG. 5c. In this embodiment, an isolation region 322 including well regions 322a and 322b is formed to surround the trench isolation structure TR, thereby forming the isolation feature ISO31. Further, an isolation region 324 including well regions 324a and 324b are formed in the substrate 310 to form the isolation feature ISO32. Although each of the isolation regions 322 and 324 includes multiple well regions in this embodiment, embodiments of the present disclosure are not limited thereto. In some embodiments, each of the isolation regions includes one well region. The well regions 322a and 324a are lightly doped with a p-type dopant, and the well regions 322b and 324b are heavily doped with a p-type dopant. Further, the doping can achieved by using an ion implantation process, a plasma immersion ion implantation process, a gas and/or solid source diffusion process, another applicable process, or a combination thereof. In some embodiments, an annealing process can be performed to activate the dopants. The annealing process can be, for example a rapid thermal annealing process.

Figure 5D:
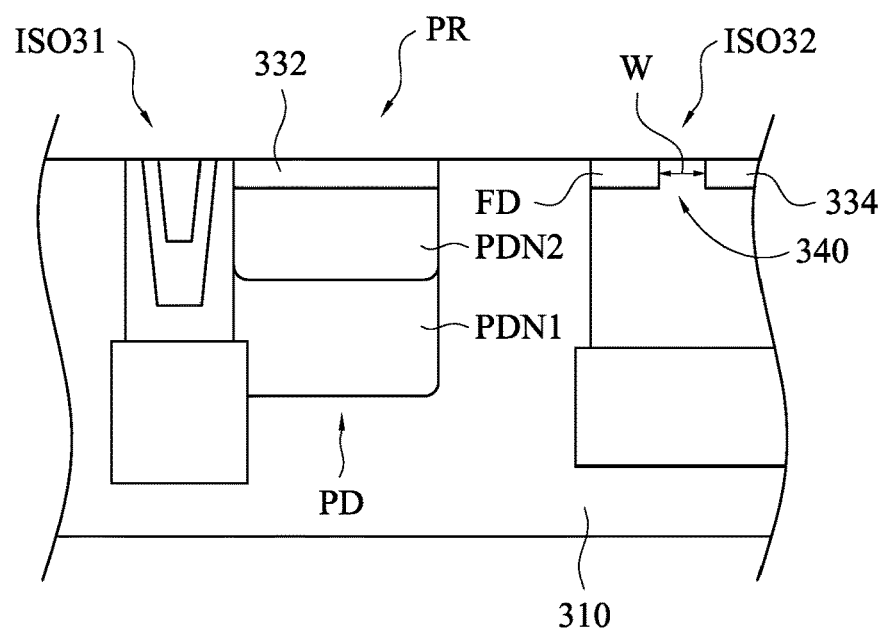

Then, operation 440 is performed to form the floating node FD, the pinning layer 334 and the light-sensitive element PD, as shown in FIG. 5d. The floating node FD and the pinning layer 334 are formed in the isolation region 324. Specifically, the floating node FD and the pinning layer 334 are located in the well region 324a. The floating node FD and the pinning layer 334 can be formed by using a mask layer, and the mask layer is designed to form a space region 340 located between the floating node FD and the pinning layer 334. In some embodiments, a width W of the space region 340 is greater than one micrometer (μm). The light-sensitive element PD is formed in the pixel region PR. In this embodiment, a well region PDN1, a well region PDN2 and a pinning layer 332 are sequentially formed. The pinning layer 332 and the pinning layer 334 have the same conductivity type, and the well regions PDN1 and PDN2 have the same conductivity type. In this embodiment, the well region PDN1 is heavily doped with an n-type dopant, the well region PDN2 is lightly doped with a n-type dopant, and the pinning layer 332 is doped with a p-type dopant. The pinning layer 332 and the pinning layer 334 are formed adjacent to a top surface of the semiconductor substrate 310, thereby preventing a defect of dangling bond generated on the top surface. Further, the doping can achieved by using an ion implantation process, a plasma immersion ion implantation process, a gas and/or solid source diffusion process, another applicable process, or a combination thereof. In some embodiments, an annealing process can be performed to activate the dopants. The annealing process can be, for example a rapid thermal annealing process.

Figure 5E:
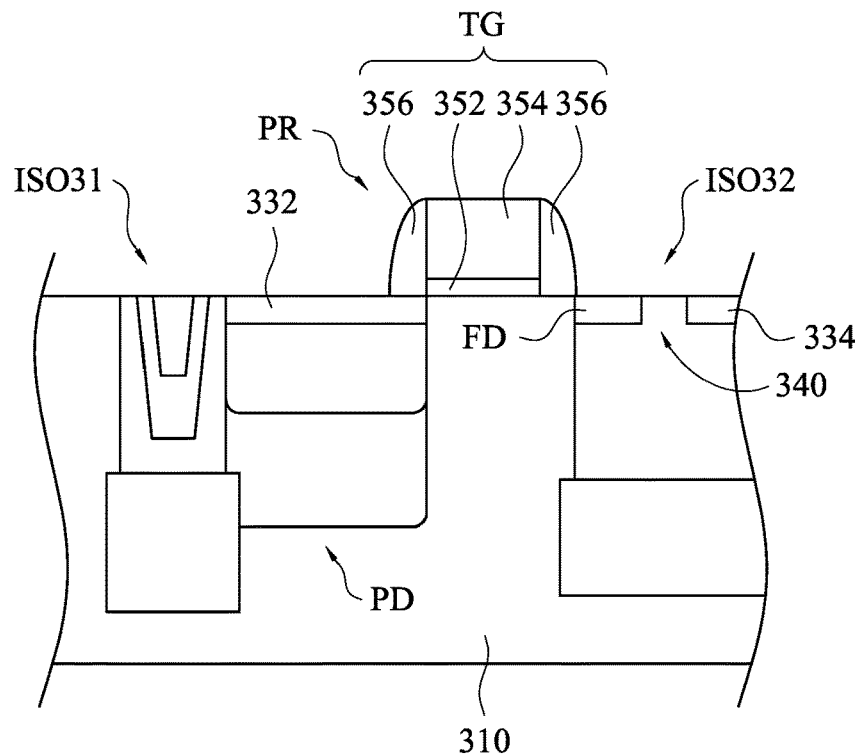

Thereafter, operation 450 is performed to form the transfer gate TG on the top surface of the semiconductor substrate 310, as shown in FIG. 5e. Specifically, the transfer gate TG is formed on the pixel region PR to transfer electrons produced by the light-sensitive element PD to the floating node FD.

The transfer gate TG includes a gate dielectric layer 352, a gate electrode layer 354 and spacers 356. The gate dielectric layer 352 can be formed by thermal oxidation, chemical vapor deposition, sputtering, or any other methods known and used in the art for forming a gate dielectric. The gate dielectric layer 352 may be formed from a high permittivity (high-k) material (e.g., with a relative permittivity greater than about 5) such as lanthanum oxide, aluminum oxide, hafnium oxide, hafnium oxynitride, or zirconium oxide, or combinations thereof. Additionally, any combination of silicon dioxide, silicon oxynitride, and/or high-k materials can also be used for the gate dielectric layer 352.

The gate electrode layer 354 can be formed from a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode layer 354 can be deposited by chemical vapor deposition (CVD), sputter deposition, or other techniques known and used in the art for depositing conductive materials.

The spacers 356 can be formed from a dielectric material, such as silicon nitride, silicon carbide, silicon oxynitride, other suitable materials, and/or combinations, but embodiments of the present disclosure are not limited thereto. The spacers 356 can be formed by methods utilized to form such a layer, such as chemical vapor deposition (CVD), plasma enhanced CVD, sputter, and other methods known in the art.

It can be understood that a leakage path between the floating node FD and the pinning layer 334 is prevented in the image sensor 100, since the space region 340 is formed between the floating node FD and the pinning layer 334. Further, in some embodiments, a doping concentration of the space region 340 is smaller than or equal to one percent of a doping concentration of the floating node FD.

Figure 6:
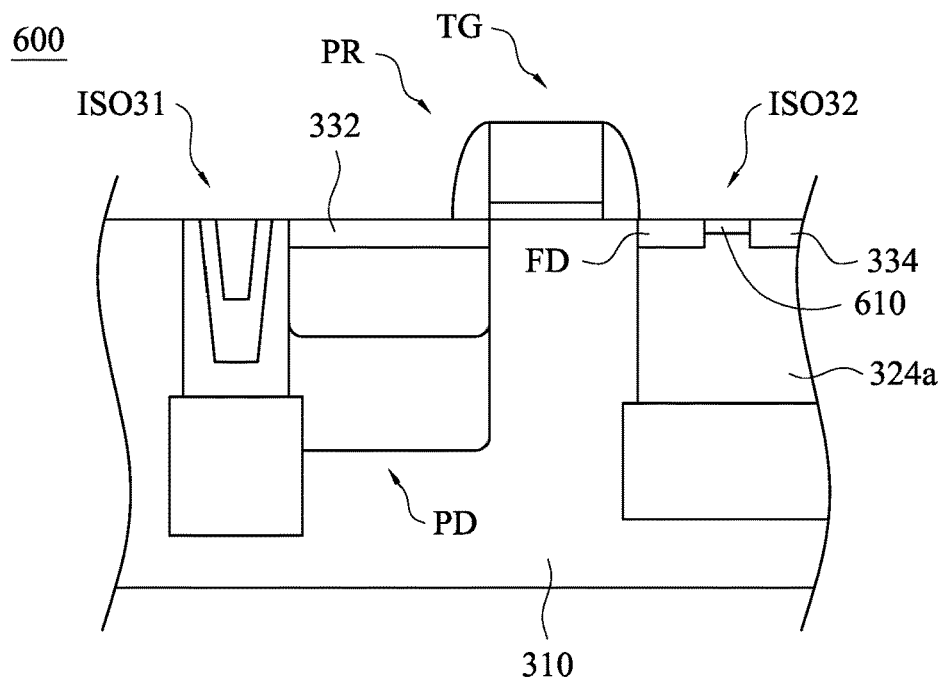
FIG. 6 is a cross-sectional view of an image sensor in accordance with an embodiment of the present disclosure.
Figure 7:
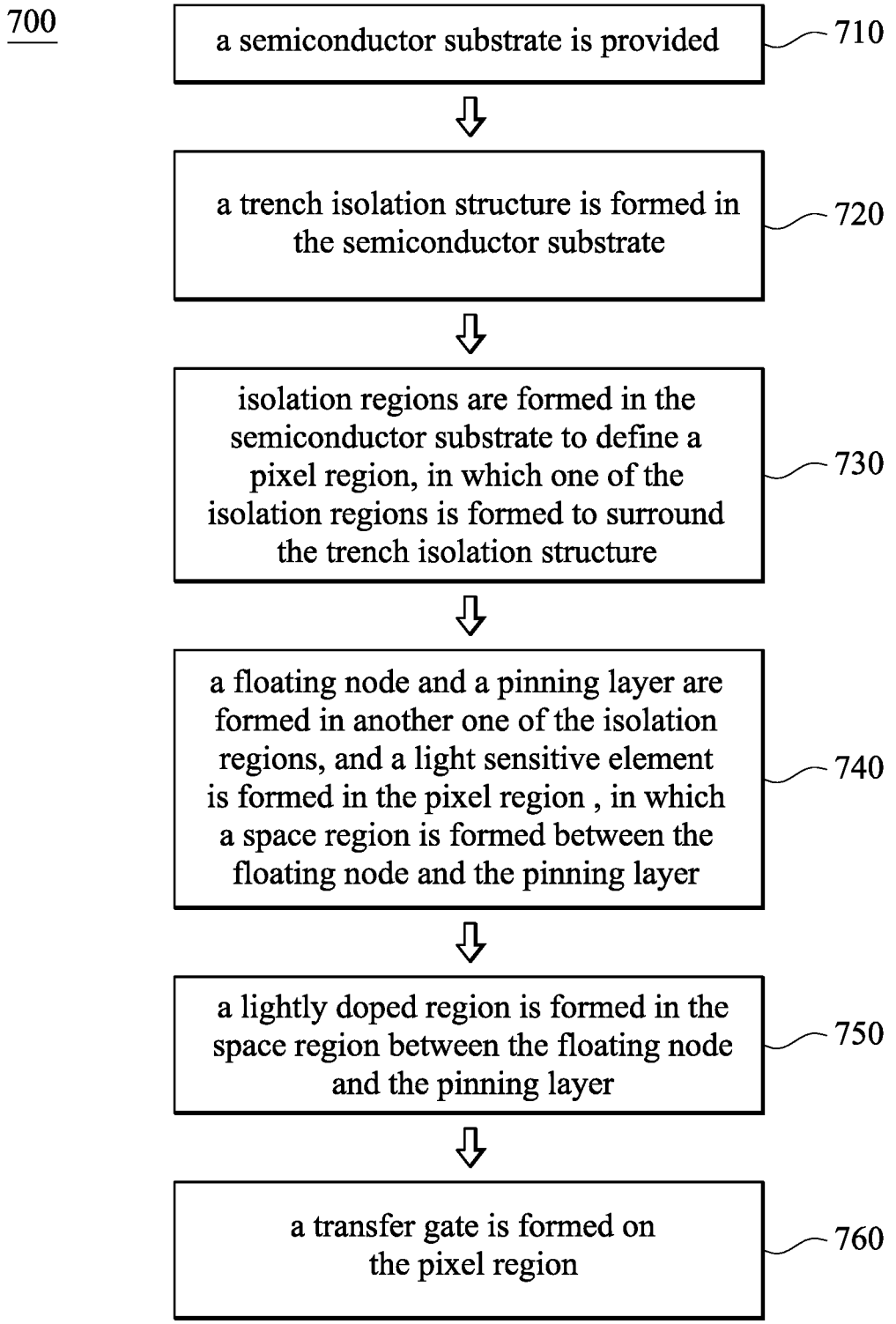
FIG. 7 is a flow chart showing a method for fabricating the image sensor in accordance with some embodiments of the present disclosure.

Referring to FIG. 6, FIG. 6 is a cross-sectional view of an image sensor 600 in accordance with an embodiment of the present disclosure. As shown in FIG. 6, the structure of the image sensor 600 is similar to the structure of the image sensor 100, but the difference is in that a lightly doped region 610 is formed between the floating node FD and the pinning layer 334. In this embodiment, the floating node FD is doped with an n-type dopant, and the pinning layer 334 is doped with a p-type dopant, the well region is lightly doped with a p-type dopant, and the lightly doped region 610 is lightly doped with an n-type dopant. In some embodiments, a doping concentration of the lightly doped region 610 is smaller than or equal to one percent of a doping concentration of the floating node FD. Since the lightly doped region 610 is located between the pining layer 334 and the floating node FD, a leakage path between the floating node FD and the pinning layer 334 is prevented.

Figure 8A:
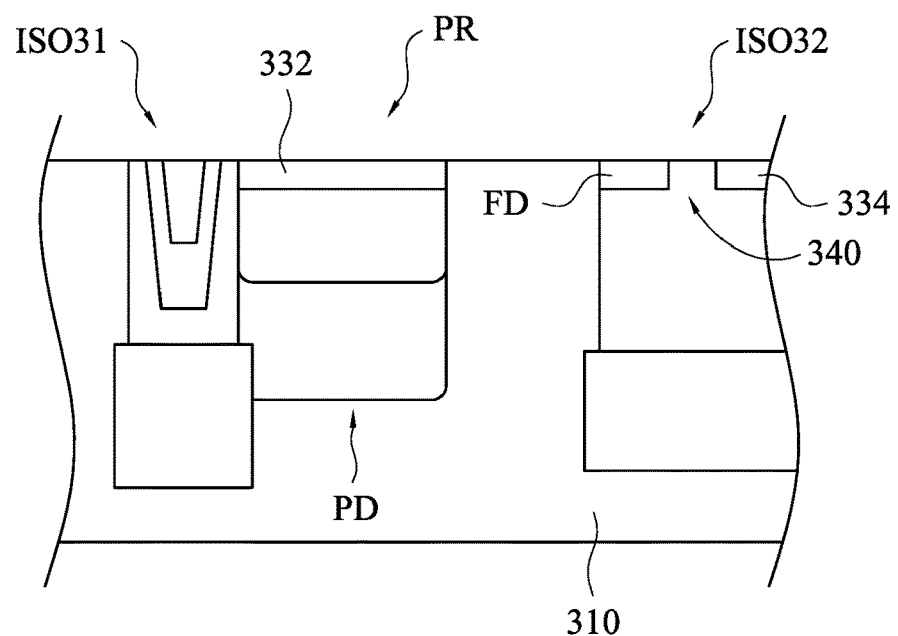
FIG. 8a to FIG. 8c are cross-sectional views of intermediate stages showing the method for fabricating the image sensor in accordance with some embodiments of the present disclosure.
Figure 8B:
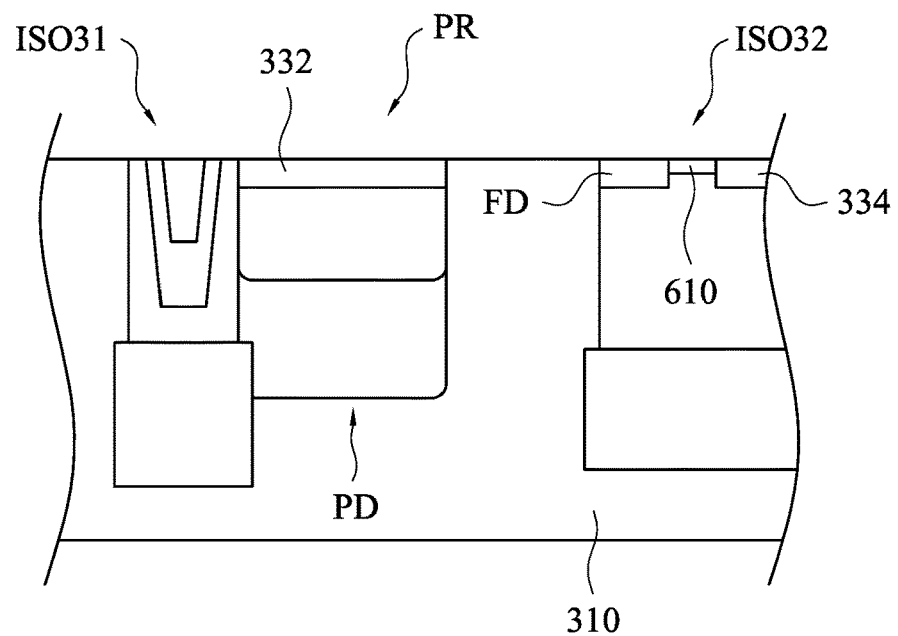
Figure 8C:
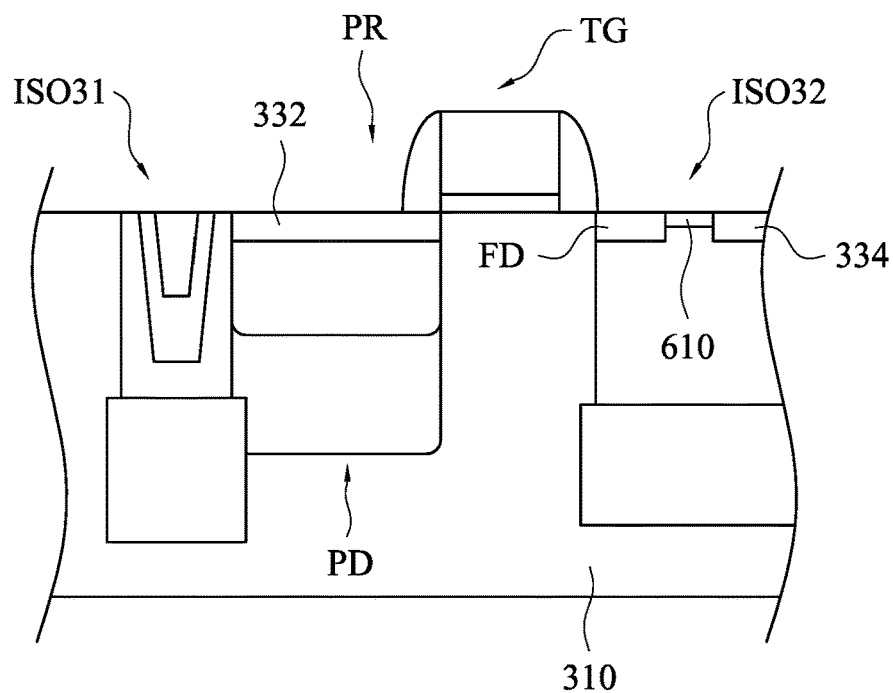

Referring to FIG. 7 and FIG. 8a to FIG. 8c, FIG. 7 is a flow chart showing a method 700 for fabricating the image sensor 600 in accordance with some embodiments of the present disclosure, and FIG. 8a to FIG. 8c are cross-sectional views of intermediate stages showing the method 700 for fabricating the image sensor 600 in accordance with some embodiments of the present disclosure. In the method 700, at first, operations 710-740 are performed to fabricate the intermediate semiconductor device as shown in FIG. 8a. The operations 710-740 are similar to the operations 410-440, thus details of the operations 710-740 are not repeated herein.

Then, operation 750 is performed to form the lightly doped region 610 in the space region 340, as shown in FIG. 8b. The formation of the lightly doped region 610 can be formed by using a mask layer. A width of the lightly doped region 610 can be equal to or smaller than the width of the space region 340. Further, the doping can achieved by using an ion implantation process, a plasma immersion ion implantation process, a gas and/or solid source diffusion process, another applicable process, or a combination thereof. In some embodiments, an annealing process can be performed to activate the dopants. The annealing process can be, for example a rapid thermal annealing process.

Thereafter, operation 760 is performed to form the transfer gate TG on the top surface of the semiconductor substrate 310, as shown in FIG. 8c. Specifically, the transfer gate TG is formed on the pixel region PR to transfer electrons produced by the light-sensitive element PD to the floating node FD. The operation 760 is similar to the operation 450, thus details of the operations 760 are not repeated herein.

It can be understood that a leakage path between the floating node FD and the pinning layer 334 is prevented in the image sensor 100, since the lightly doped region 610 is formed between the floating node FD and the pinning layer 334. Further, in some embodiments, a doping concentration of the lightly doped region 610 is smaller than or equal to one percent of a doping concentration of the floating node FD.

Figure 9:
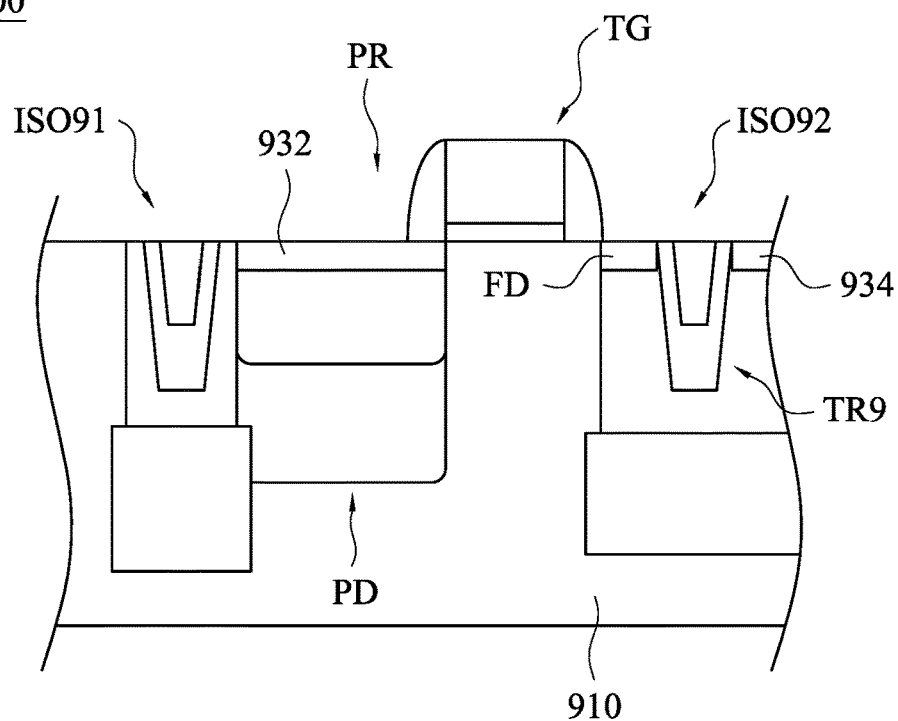
FIG. 9 is a cross-sectional view of an image sensor in accordance with an embodiment of the present disclosure.
Figure 10:
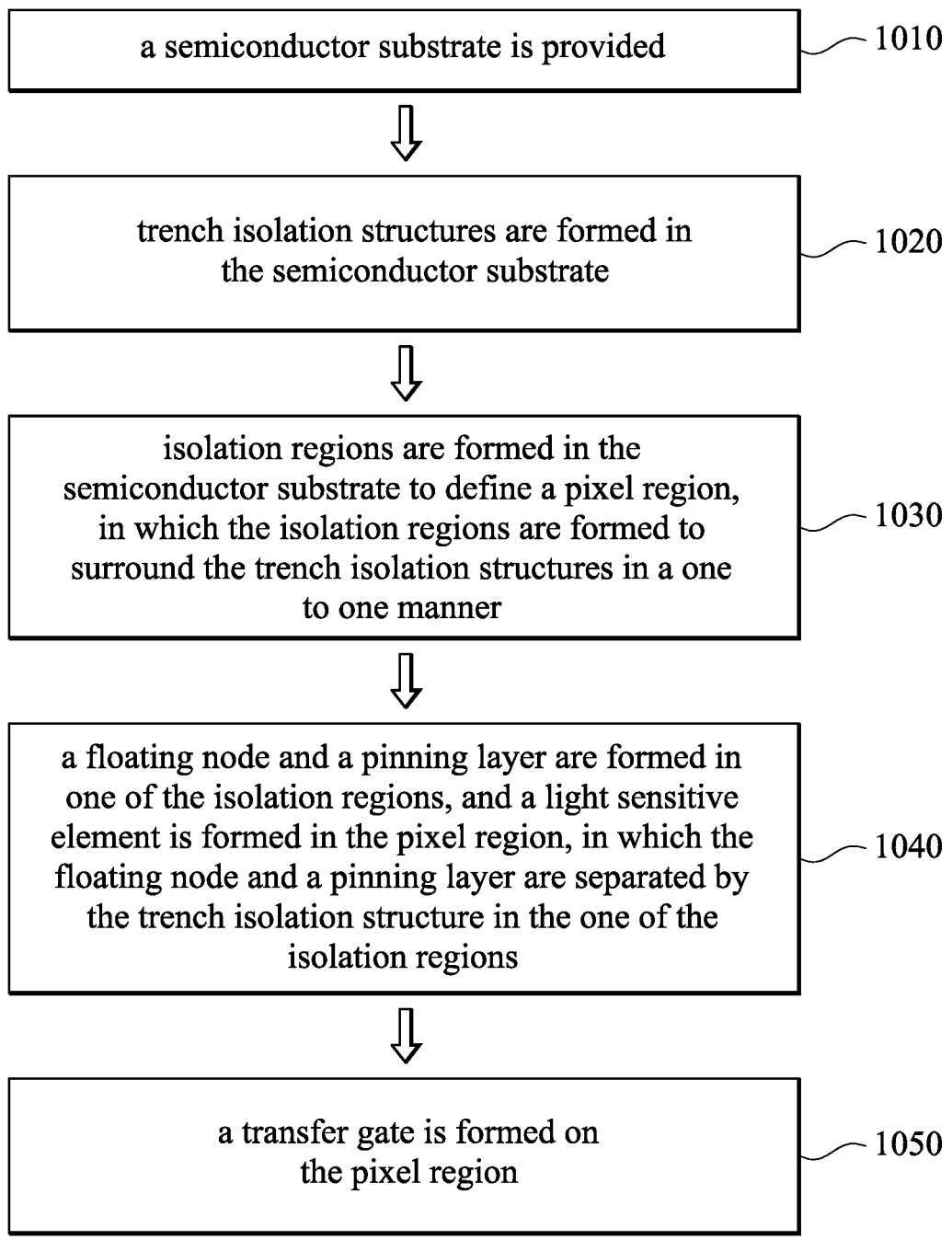
FIG. 10 is a flow chart showing a method 1000 for fabricating the image sensor in accordance with some embodiments of the present disclosure.

Referring to FIG. 9, FIG. 9 is a cross-sectional view of an image sensor 900 in accordance with an embodiment of the present disclosure. As shown in FIG. 9, the structure of the image sensor 900 is similar to the structure of the image sensor 100, but a difference is in that a trench isolation structure TR9 is formed between the floating node FD and a pinning layer 934, in which the floating node FD is doped with an n-type dopant and the pinning layer 934 is formed doped with a p-type dopant. Since the trench isolation structure TR9 is located between the pining layer 934 and the floating node FD, a leakage path between the floating node FD and the pinning layer 934 is prevented.

Figure 11A:
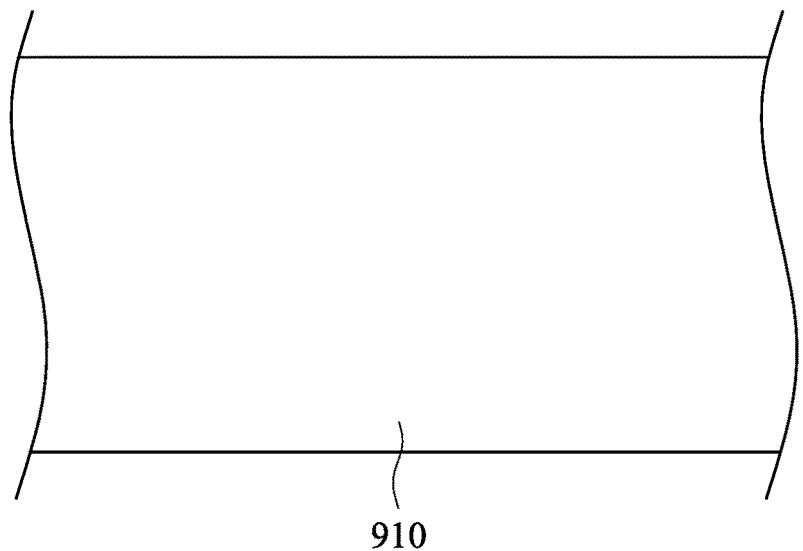
FIG. 11a to FIG. 11e are cross-sectional views of intermediate stages showing the method for fabricating the image sensor in accordance with some embodiments of the present disclosure.

Referring to FIG. 10 and FIG. 11a to FIG. 11e, FIG. 10 is a flow chart showing a method 1000 for fabricating the image sensor 900 in accordance with some embodiments of the present disclosure, and FIG. 11a to FIG. 11e are cross-sectional views of intermediate stages showing the method 900 for fabricating the image sensor 1000 in accordance with some embodiments of the present disclosure. In the method 1000, at first, operation 1010 is performed to provide a semiconductor substrate 910, as shown in FIG. 11a. The substrate 910 may be a semiconductor material and may include structures including a graded layer or a buried oxide, for example. In some embodiments, the substrate 910 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 910. Alternatively, the silicon substrate 910 may be an active layer of a semiconductor-on-insulator (SOI) substrate or a multi-layered structure such as a silicon-germanium layer formed on a bulk silicon layer. In this embodiment, the substrate 910 is doped with p-type dopant.

Figure 11B:
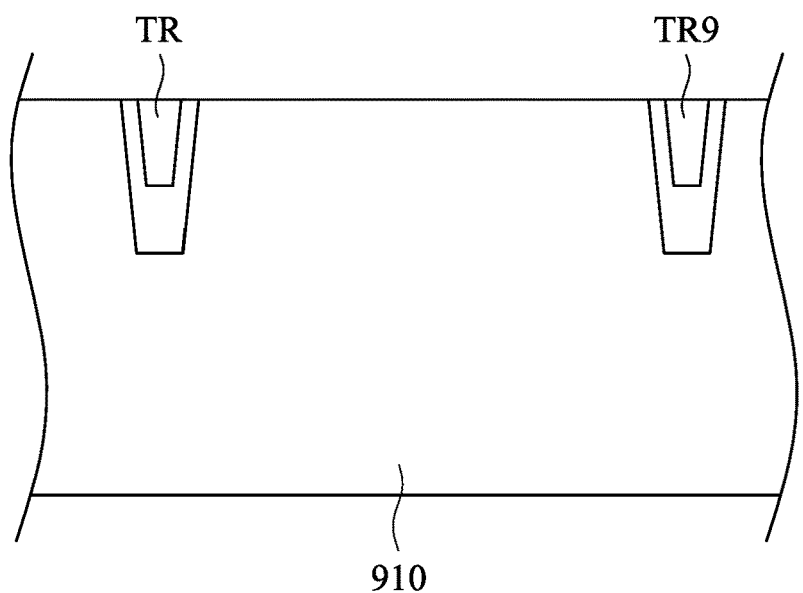
Figure 11C:
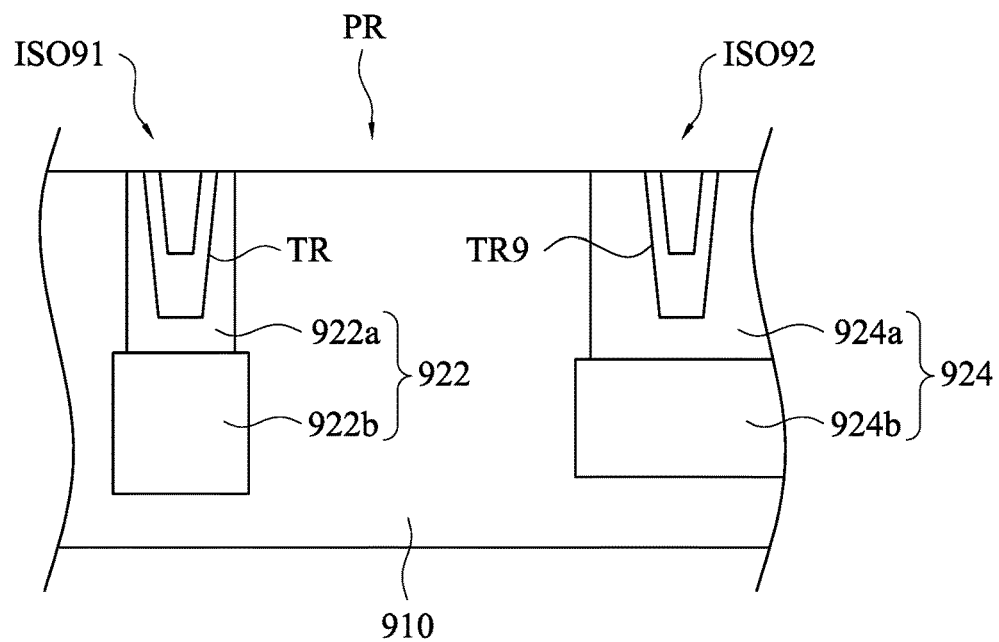

Then, operation 1020 is performed to form the trench isolation structure TR and a trench isolation structure TR9 in the semiconductor substrate 310, as shown in FIG. 11*b*. In this embodiment, the trench isolation structure TR9 is a shallow trench isolation (STI) structure, but embodiments of the present disclosure are not limited thereto. In some embodiments, the formation of the trench isolation structures TR and TR9 may include dry etching a trench in the substrate 910 and filling the trench with insulator materials such as silicon oxide, silicon nitride, or silicon oxynitride. The filled trench may have a multi-layer structure such as a thermal oxide liner layer filled with silicon nitride or silicon oxide. In some embodiments, the trench isolation structure TR may be formed by using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

Thereafter, operation 1030 is performed to form isolation regions 922 and 924 in the substrate 910 to define a pixel region PR, as shown in FIG. 5*c*. In this embodiment, an isolation region 922 including well regions 922*a* and 922*b* is formed to surround the trench isolation structure TR, thereby forming the isolation feature ISO91. Further, an isolation region 924 including well regions 924*a* and 924*b* is formed in the substrate 910 to surround the trench isolation structure TR9, thereby forming the isolation feature ISO92. The isolation regions 922 and 924 are formed to surround the trench isolation structures TR and TR9 in a one-to one manner. Although each of the isolation regions 922 and 924 includes multiple well regions in this embodiment, embodiments of the present disclosure are not limited thereto. In some embodiments, each of the isolation regions includes one well region. The well regions 922*a* and 924*a* are lightly doped with a p-type dopant, and the well regions 922*b* and 924*b* are heavily doped with a p-type dopant. Further, the doping can achieved by using an ion implantation process, a plasma immersion ion implantation process, a gas and/or solid source diffusion process, another applicable process, or a combination thereof. In some embodiments, an annealing process can be performed to activate the dopants. The annealing process can be, for example a rapid thermal annealing process.

Figure 11D:
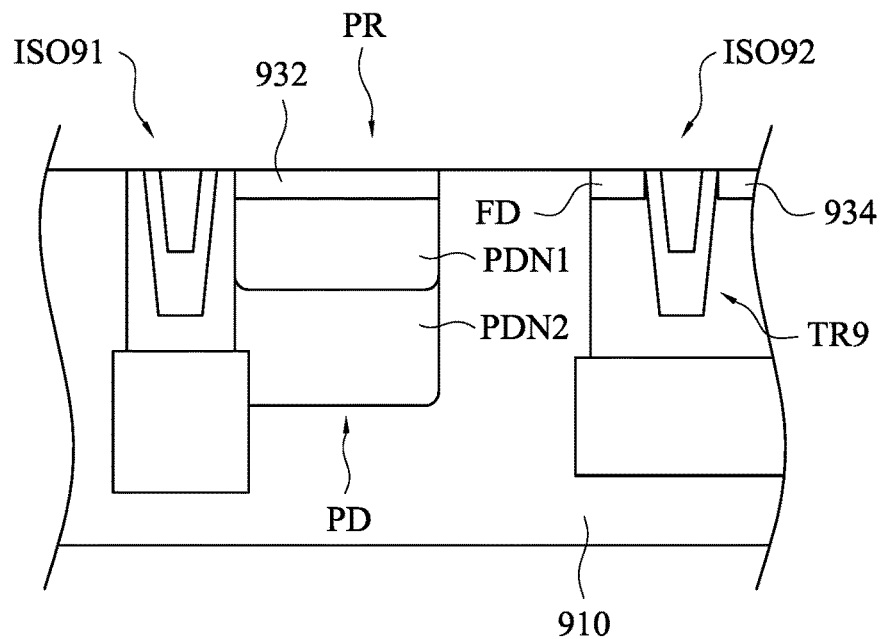

Then, operation 1040 is performed to form the floating node FD, the pinning layer 934 and the light-sensitive element PD, as shown in FIG. 11*d*. The floating node FD and the pinning layer 934 are formed in the isolation region 924. In this embodiment, the floating node FD and the pinning layer 934 are located in the well region 924*a*, and the floating node FD and the pinning layer 934 are disposed at opposite sides of the trench isolation structure TR9. Further, the doping can achieved by using an ion implantation process, a plasma immersion ion implantation process, a gas and/or solid source diffusion process, another applicable process, or a combination thereof. In some embodiments, an annealing process can be performed to activate the dopants. The annealing process can be, for example a rapid thermal annealing process.

Figure 11E:
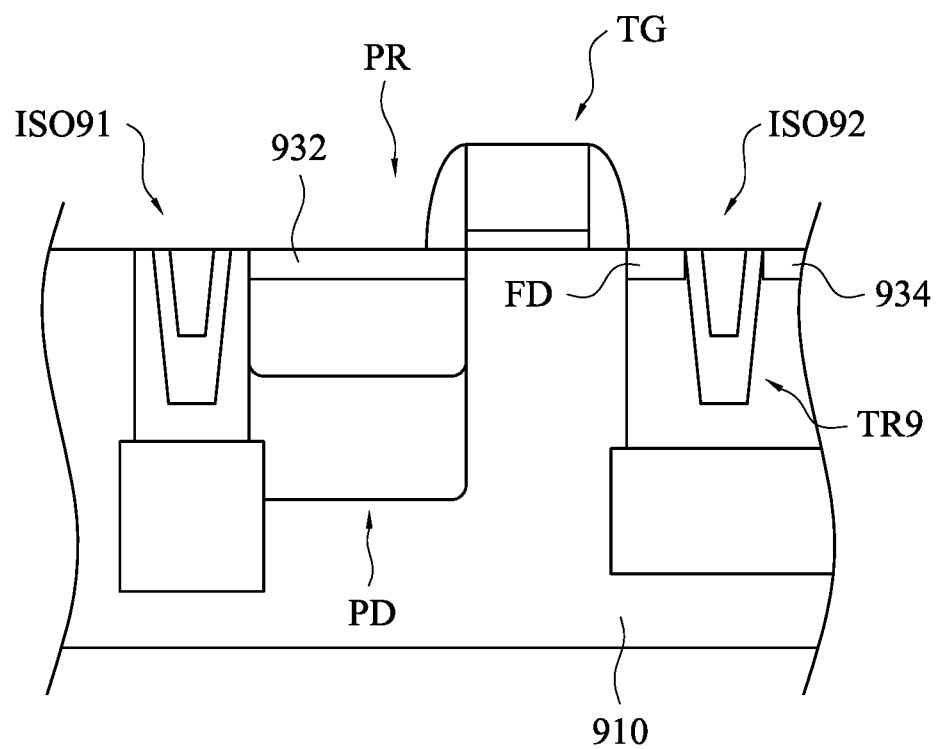

Thereafter, operation 1050 is performed to form the transfer gate TG on the top surface of the semiconductor substrate 310, as shown in FIG. 11*e*. Specifically, the transfer gate TG is formed on the pixel region PR to transfer electrons produced by the light-sensitive element PD to the floating node FD.

It can be understood that that trench isolation structure TR9 is used to isolate the pinning layer 934 from the floating node FD in the image sensor 900, and the trench isolation structure TR9 is formed together with the trench isolation structure TR in the fabrication method 900. The trench isolation structure TR9 provides good isolation function to prevent a leakage path between the pinning layer 934 and the floating node FD, thereby eliminating a white pixel pattern induced by the leakage path.

In accordance with an embodiment of the present disclosure, the present disclosure discloses a semiconductor device. The semiconductor device includes an isolation region, a pixel and a first pinning layer. The pixel includes a light-sensitive element, a transfer gate and a floating node, in which the floating node is located in the isolation region and has a first conductivity type. The first pinning layer is formed in the isolation region, in which the first pinning layer has a second conductivity type different from the first conductivity type. a space region that is a portion of the isolation region is sandwiched between the floating node and the first pinning layer.

In accordance with another embodiment of the present disclosure, the present disclosure discloses a fabrication method of an image sensor. In the fabrication method, at first, a semiconductor substrate is formed. Then, a trench isolation structure is formed in the semiconductor substrate. Thereafter, a first isolation region and a second isolation region are formed in the semiconductor substrate to define a pixel region, in which the first isolation region is formed to surround the trench isolation structure. Then, a floating node and a pinning layer are formed in the second isolation region, in which a space region that is a portion of the second isolation region is sandwiched between the floating node and the pinning layer, and the floating node has a first conductivity type different from a second conductivity type of the pinning layer. Thereafter, a light-sensitive element is formed in the pixel region. A transfer gate is formed on the pixel region to form a pixel.

In accordance with another embodiment of the present disclosure, the present disclosure discloses a fabrication method of an image sensor. In the fabrication method, at first, a semiconductor substrate is formed. Then, trench isolation structures are formed in the semiconductor substrate. Thereafter, a first isolation region and a second isolation region are formed in the semiconductor substrate to define a pixel region, in which the first isolation region and the second isolation region are formed to surround the trench isolation structures in a one to one manner. Then, a floating node is formed in the second isolation region, in which the floating node has a first conductivity type and is located at a first side of the trench isolation structure in the second isolation region. Thereafter, a pinning layer is formed in the second isolation region, in which the pinning layer has a second conductivity type different form the first conductivity type and is located at a second side of the trench isolation structure in the second isolation region, and the second side is opposite to the first side. Then, a light-sensitive element is formed in pixel region. Thereafter, a transfer gate is formed on the pixel region to form a pixel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate having an isolation region;
    a pixel comprising a light-sensitive element, a transfer gate and a floating node, wherein the floating node is located in the isolation region and has a first conductivity type;
    a first pinning layer formed in the isolation region, wherein the first pinning layer has a second conductivity type different from the first conductivity type; and
    a second pinning layer formed adjacent to a top surface of the semiconductor substrate on which the transfer gate is formed;
    wherein a space region that is a portion of the isolation region is sandwiched between the floating node and the first pinning layer.

2. The semiconductor device of claim 1, wherein a width of the space region is greater than one micrometer (µm).

3. The semiconductor device of claim 1, wherein the space region has the second conductivity type and a doping concentration of the space region is smaller than or equal to one percent of a doping concentration of the floating node.

4. The semiconductor device of claim 1, further comprising a trench isolation structure formed in the space region to isolate the floating node from the first pinning layer.

5. The semiconductor device of claim 4, wherein the trench isolation structure is a shallow trench isolation (STI).

6. The semiconductor device of claim 1, further comprising a lightly doped region formed in the space region, wherein the lightly doped region has the first conductivity type and a doping concentration of the lightly doped region is smaller than or equal to one percent of a doping concentration of the floating node.

7. The semiconductor device of claim 6, wherein a width of the lightly doped region is greater than one micrometer (µm).

8. The semiconductor device of claim 1, wherein the light-sensitive element is a photodiode.

9. The semiconductor device of claim 1, wherein the first pinning layer is formed adjacent to the top surface of the semiconductor substrate.

10. A semiconductor device, comprising:
    an isolation region;
    a pixel comprising a light-sensitive element, a transfer gate and a floating node, wherein the floating node is located in the isolation region and has a first conductivity type, and the transfer gate is disposed between the light-sensitive element and the floating node;
    a first pinning layer formed in the isolation region, wherein the first pinning layer has a second conductivity type different from the first conductivity type, and a space region that is a portion of the isolation region is sandwiched between the floating node and the first pinning layer; and
    a trench isolation structure formed in the space region to isolate the floating node from the first pinning layer.

11. The semiconductor device of claim 10, wherein transfer gate comprises:
    a gate dielectric layer;
    a gate electrode layer disposed on the gate dielectric layer; and
    a plurality of spacers disposed on sidewalls of the gate electrode layer.

12. The semiconductor device of claim 11, wherein material of the gate dielectric layer comprises a high permittivity (high-k) material.

13. The semiconductor device of claim 11, wherein material of the gate electrode layer comprises a conductive material.

14. The semiconductor device of claim 13, wherein the conductive material is selected from a group comprising of polycrystalline-silicon (poly-Si), poly-crystalline silicon-germanium (poly-SiGe), metallic nitrides, metallic silicides, metallic oxides, metals, combinations thereof.

15. The semiconductor device of claim 14, wherein the metals comprises tungsten, titanium, aluminum, copper, molybdenum, nickel or platinum.

16. The semiconductor device of claim 11, wherein material of the spacers comprises nitride, silicon carbide, silicon oxynitride.

17. A semiconductor device, comprising:
    an isolation region;
    a pixel comprising a light-sensitive element, a transfer gate and a floating node, wherein the floating node is located in the isolation region and has a first conductivity type; and
    a first pinning layer formed in the isolation region, wherein the first pinning layer has a second conductivity type different from the first conductivity type, and a space region that is a portion of the isolation region is sandwiched between the floating node and the first pinning layer, and the second conductivity type of the first pinning layer is p-type, and the first conductivity type of the floating node is n-type; and
    a lightly doped region formed in the space region, wherein the lightly doped region has the first conductivity type and a doping concentration of the lightly doped region is smaller than or equal to one percent of a doping concentration of the floating node.

18. The semiconductor device of claim 17, wherein the semiconductor device includes a source follower configured to receive electrons of the light-sensitive element.

19. The semiconductor device of claim 18, wherein the source follower receives the electrons of the light-sensitive element through the floating node.

20. The semiconductor device of claim 1, wherein the second pinning layer is formed over the light-sensitive element.

* * * * *